US010798856B2

(12) United States Patent
Barrett (10) Patent No.: US 10,798,856 B2
(45) Date of Patent: Oct. 6, 2020

(54) APPARATUS FOR HOLDING A PRINTED CIRCUIT BOARD

(71) Applicant: Protosonic Limited, County Donegal (IE)

(72) Inventor: Niall Barrett, County Donegal (IE)

(73) Assignee: PROTOSONIC LIMITED, County Donegal (IE)

( * ) Notice: Subject to any disclaimer, the term of this patent is extended or adjusted under 35 U.S.C. 154(b) by 43 days.

(21) Appl. No.: 15/780,256

(22) PCT Filed: Dec. 1, 2016

(86) PCT No.: PCT/EP2016/079405
§ 371 (c)(1),
(2) Date: May 31, 2018

(87) PCT Pub. No.: WO2017/093388
PCT Pub. Date: Jun. 8, 2017

(65) Prior Publication Data
US 2018/0359887 A1 Dec. 13, 2018

(30) Foreign Application Priority Data
Dec. 3, 2015 (GB) .................................. 1521345.7

(51) Int. Cl.
*H05K 13/00* (2006.01)
*B23K 3/08* (2006.01)
(Continued)

(52) U.S. Cl.
CPC ......... *H05K 13/0069* (2013.01); *B23K 3/087* (2013.01); *H05K 13/0053* (2013.01);
(Continued)

(58) Field of Classification Search
CPC .......... H05K 13/0069; H05K 13/0053; H05K 2201/10303; H05K 3/3468; B23K 3/087
(Continued)

(56) References Cited

U.S. PATENT DOCUMENTS 6,071,756 A 6/2000 Sines et al.
7,311,302 B1 12/2007 Farlow et al.
(Continued)

FOREIGN PATENT DOCUMENTS

EP 0321525 B1 * 3/1994 .......... H05K 3/3447
JP 2006019482 A 1/2006
JP 2007273565 A 10/2007

*Primary Examiner* — Lee D Wilson
*Assistant Examiner* — Katina N. Henson
(74) *Attorney, Agent, or Firm* — Standley Law Group LLP; Stephen L. Grant (57) ABSTRACT

An apparatus for holding a printed circuit board when mounting components thereon, said apparatus comprising a base plate, a mounting device for mounting a printed circuit board spaced from and substantially parallel to the base plate, a plurality of elongate support pins extending through respective holes within the base plate to extend transversely from the base plate, the support pins being independently positionable in height with respect to the base plate to define a configurable support surface for supporting components mounted on the printed circuit board during soldering, wherein the height that each pin extends from the base plate can be adjusted such that the support surface defined by the support pins can correspond to the topography of the circuit board and the components mounted thereon, a locking mechanism being provided for selectively locking the position of each support pin with respect to the base plate, wherein said locking mechanism comprises at least one (Continued)

elongate flexible member arranged to extend around a plurality of said support pins in convolute manner, tensioning device being associated with said at least one flexible member, whereby said tensioning device is adapted to selectively apply tension to said at least one flexible member to grip the pins around which said flexible member extends to lock the position of said pins with respect to the base plate.

19 Claims, 12 Drawing Sheets

(51) Int. Cl.
    *H05K 3/34*     (2006.01)
    *B23K 101/42*     (2006.01)

(52) U.S. Cl.
    CPC ........ *B23K 2101/42* (2018.08); *H05K 3/3421* (2013.01); *H05K 3/3447* (2013.01); *H05K 2203/0173* (2013.01)

(58) Field of Classification Search
    USPC .......................................... 269/166, 54.4, 266
    See application file for complete search history.

(56) References Cited

U.S. PATENT DOCUMENTS

| | | |
|---|---|---|
| 2006/0096960 A1 | 5/2006 | Carson et al. |
| 2006/0244190 A1 | 11/2006 | Erdmann |
| 2007/0056178 A1* | 3/2007 | Kleyman ............... G01B 5/207 |
| | | 33/561.1 |
| 2008/0203637 A1* | 8/2008 | Li ........................... B25B 1/103 |
| | | 269/71 |
| 2009/0126187 A1 | 5/2009 | Kajiyama et al. |

* cited by examiner

APPARATUS FOR HOLDING A PRINTED CIRCUIT BOARD

FIELD OF THE INVENTION

This invention relates to an apparatus for holding a printed circuit board (PCB) and in particular to an apparatus for holding a printed circuit board to facilitate the soldering of components onto the PCB.

BACKGROUND OF THE INVENTION

When attaching components to a printed circuit board, after inserting the pins of the components through holes in the board and locating the components in place on the board, it is necessary to invert the board to provide access to the pins of the components on the underside of the board for soldering to the electrically conductive tracks of the board. During such operation it is necessary to support the components on the upper side of the board so that they do not move or fall out of the board before the pins have been soldered. However, due to the different dimensions of the components the topography of the components on the upper side of the board varies and therefore the support surface must typically be exchanged or altered for each PCB arrangement to be assembled.

It is known to provide a support surface defined by a plurality of spring loaded pins, whereby the pins can be individually displaced against a spring biasing force so that the support surface conforms to the topography of the PCB and the components mounted thereon. Such arrangement is disclosed in U.S. Pat. No. 5,984,293. However, the provision of individually spring loaded pins exert a variable force on the components and board dependent upon how far the pins are displaced. Such variable force may damage or dislodge the components from their desired position. Also, the force applied to the PCB by the spring loaded pins may distort the board.

SUMMARY OF THE INVENTION

According to the present invention there is provided an apparatus for holding a printed circuit board when mounting components thereon as claimed in claim 1.

In one embodiment said at least one flexible member may extend around a plurality of said support pins in convolute manner, wherein said at least one flexible member grips said plurality of support pins to lock the position of said support pins when in its tensioned configuration.

In a preferred embodiment said plurality of support pins are arranged in an array of rows and columns, a respective flexible member being arranged to extend around each row of support pins in convolute manner to grip the pins in a respective row when tension is applied to the respective flexible member by the tensioning device.

Preferably a plurality of said elongate flexible members are arranged in a plurality of parallel rows corresponding to said rows of said array of support pins, said tensioning device comprising a pair of opposed anchor members between which the elongate flexible members extend, at least one of said anchor members being displaceable away from the other of said anchor members by an actuating device to define said tensioning device, whereby operation of said actuating device displaces at least one anchor member away from the other to apply tension to the elongate flexible members, thereby locking the support pins in position within their apertures.

Said actuating device may comprise a cam having a cam surface arranged to act upon the at least one anchor member to displace said at least one anchor member away from the other when moved to an operative configuration, thus applying tension to said elongate flexible members, and to release tension on said elongate flexible members when the cam is moved to an inoperative configuration. Said cam may include an actuating lever for moving said cam between its operative and inoperative configurations. Alternatively the actuating device may comprise a nut or knob threadedly engaged on a cooperating portion of at least one of the anchor member, whereby the nut or knob can be screwed onto said cooperating portion of the anchor member to displace the anchor members away from each other, thus applying tension to the elongate flexible members.

In one embodiment each elongate flexible member may be attached to and extends between a pair of transversely extending anchor members extending parallel to the ends of the base plate, each anchor member being associated with a respective actuating device, whereby operation of the actuating device displaces said anchor members away from one another to apply tension to the flexible members extending therebetween. Each actuating device may comprise a lever operated cam having a cam surface arranged to act upon the respective anchor member to displace said anchor members away from one another when the cams are moved to an operative configuration, thus applying tension to said elongate flexible members, and to release tension on said elongate flexible members when the cams are moved to an inoperative configuration.

Said mounting device may comprise a pair of opposed clamp members spaced from and extending parallel to said base plate, whereby said clamp members are adapted to engage opposite sides of a PCB to hold the PCB spaced from and parallel to said base plate at a position whereby a first end of said support pins can act against the PCB and any components mounted thereon. Said clamp members may be mounted on the base plate via respective carriers, each carrier being slideably mounted on the base plate for movement in a direction parallel to the base plate to permit the clamp members to be moved towards and away from one another. In one embodiment said carriers may be slideably mounted on parallel guide rails or tracks arranged on either side of said base plate. Said carriers may be provided with a biasing device biasing said clamp members towards one another. Said biasing device may comprise springs mounted on said guide rails or tracks acting between a respective end of the guide rail or track and a mounting portion of the respective carrier.

The clamp members may be mounted on said carriers via respective slides whereby each clamp member can be slid laterally with respect to the base plate between a loading position located to one side of the base plate and an operative position facing said base plate.

Support device may be provided on the base plate extending from the base plate to allow the apparatus to rest upon a surface upon said support device in a first configuration with said mounting device beneath said base plate and a second configuration with said mounting device above the base plate, the apparatus being moveable between said first and second configurations by inverting the apparatus, said pins are adapted to fall under gravity into contact with a populated side of a printed circuit board assembly when the PCB is mounted is said mounting device with the apparatus in its first configuration and when said locking mechanism is operated to release said pins to slide freely within the apertures in the base plate, the underside of the PCB being exposed to facilitate soldering of the pins when the apparatus is in its second configuration, with the locking mechanism operated to lock the support pins in their apertures such that the pins provide a support surface for the populated side of the PCB.

Preferably said support pins are provided with enlarged ends to prevent the support pins from falling out of the apertures.

Preferably the pins are formed from a rigid metallic or plastic material. The pins may be coated with an electrically and/or thermally insulating coating to provide protection to components in contact therewith from electrostatic discharge and/or to prevent heat transfer to the pins from the components during soldering.

In an alternative embodiment said at least one flexible member may be formed from an elastic material, and wherein said at least one flexible member is located between adjacent rows of support pins, wherein said at least one flexible member, when in its relaxed configuration, is dimensioned to engage and grip the sides of the support pins in said adjacent rows to lock the position of said pins with respect to the base plate, and wherein, when the at least one flexible member is elastically stretched when in its tensioned configuration such that the width of the at least one flexible member is reduced to the extent that the at least one flexible member no longer grips the sides of the support pins in said adjacent rows, allowing the pins to move freely with respect to the base plate.

BRIEF DESCRIPTION OF THE DRAWINGS

An embodiment of the present invention will now be described, by way of example only, with reference to the accompanying drawings, in which:—

DETAILED DESCRIPTION OF THE DRAWINGS

Figure 1:
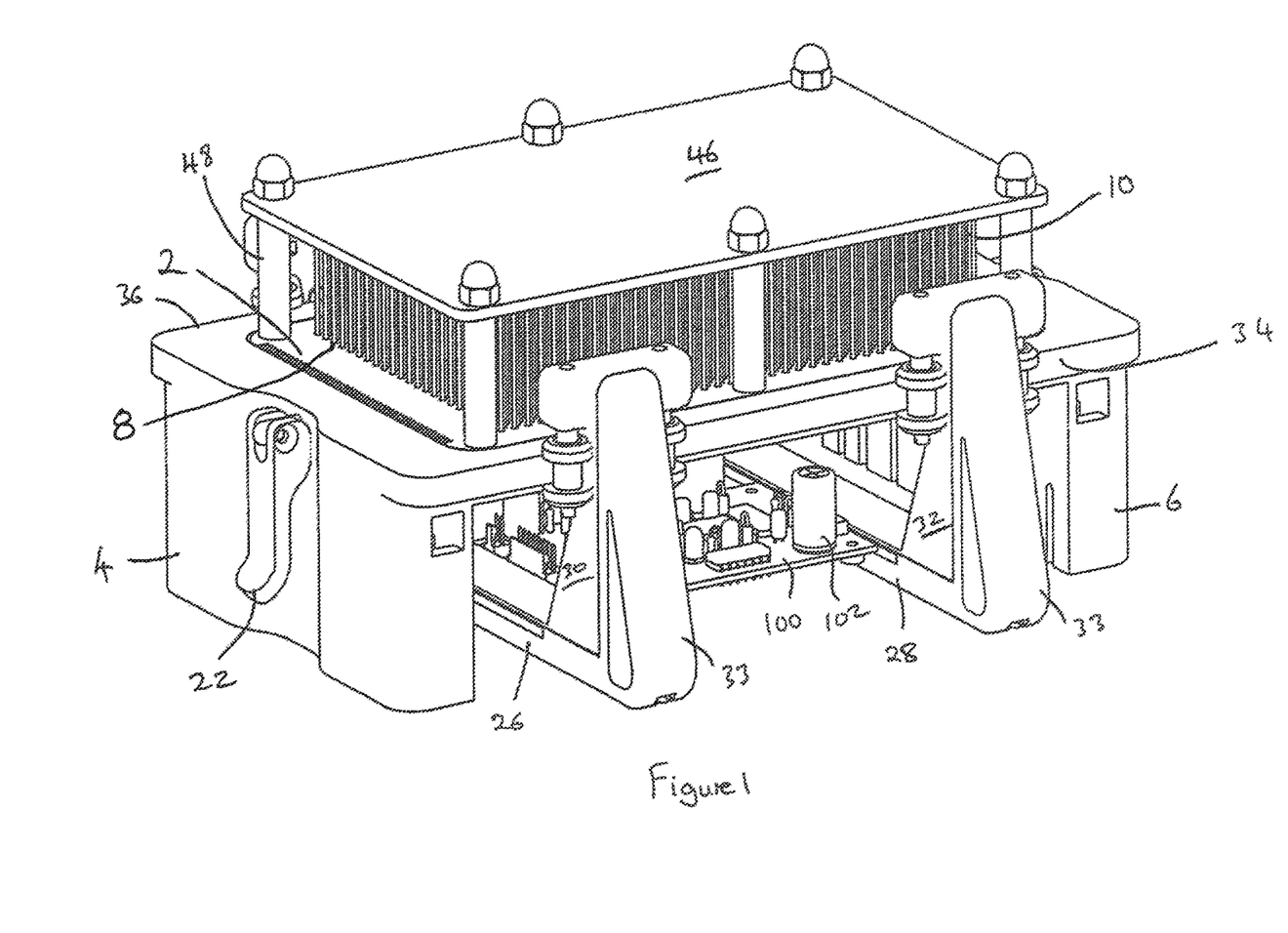
FIG. 1 is a perspective view of an apparatus for holding a printer circuit board in accordance with an embodiment of the present invention.

As illustrated in FIGS. 1 to 11, an apparatus for holding a printed circuit board (PCB) in accordance with an embodiment of the present invention comprises a planar base plate 2 having a pair of vertical end plates 4,6 extending perpendicularly from either end of the base plate 2 defining legs upon which the apparatus may rest, as shown in FIG. 1. The end plates 4,6 may be provided with fittings and apertures for enable the attachment of additional components, as will be described below in more detail. The end plates 4,6 may also be provided with angled side faces upon which the apparatus may be placed to arrange the apparatus in different positions/orientations to facilitate operations on a PCB 100 mounted thereon.

Figure 2:
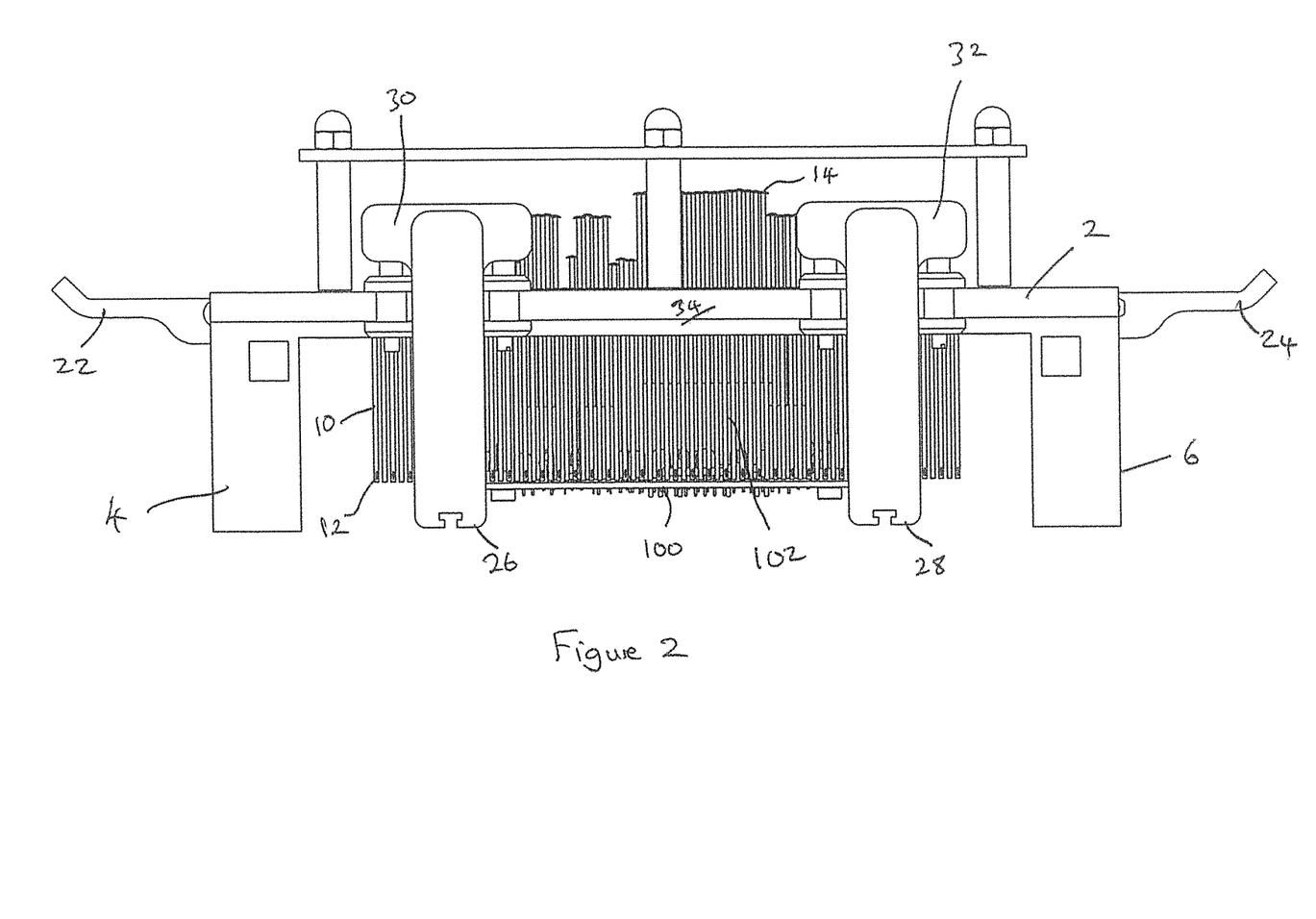
FIG. 2 is a side view of the apparatus of FIG. 1.
Figure 3:
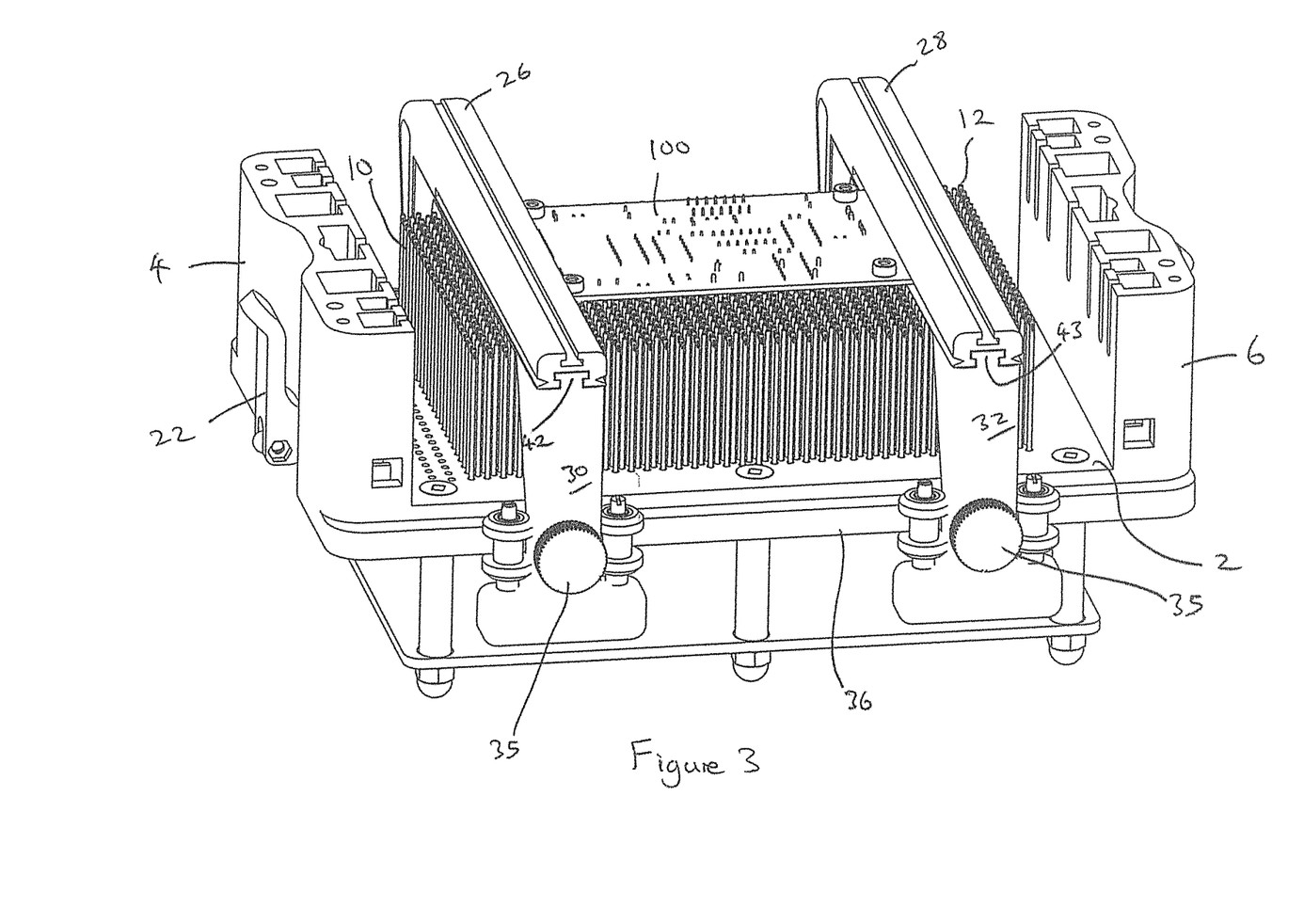
FIG. 3 is a further perspective view of the apparatus of FIG. 1.

The base plate 2 has a plurality of apertures 8 formed therein within which are mounted a rectangular array of rigid support pins 10, formed from a metal or suitable plastic material, arranged in a plurality of rows and columns. Each support pin 10 extends transversely from the base plate 2 and is slideable within the respective aperture to be displaceable with respect to the base plate 2 along the axis of the pin 10. Each support pin 10 has a first end 12, the first ends 12 of the array of support pins 10 defining a reconfigurable support surface for supporting components mounted on a PCB 100, as best shown in FIGS. 2 and 3. Each pin 10 may have a flattened and enlarged second end 14, opposite said first end 12, peened over or otherwise formed to prevent the pin 10 from falling out of its aperture 8 in the base plate 2. Each pin may be coated with an electrically and/or thermally insulating material, such as polyphenylene sulphide (PPS) or polyetheretherketone (PEEK) to reduce the risk of electrical discharge between the pins 10 and any electrical components in contact therewith and to reduce thermal conduction between the pins and the components in contact therewith, for example during soldering.

The support pins 10 are independently positionable with respect to the base plate 2 to adjust the height at which each pin extends from the base plate 2, such that the first ends 12 of the array of pins 10 define a reconfigurable support surface for supporting components 102 mounted on the PCB 100 during soldering, wherein the height of the first end 12 of each pin 10 from the base plate 2 can be adjusted such that the support surface defined by the first ends 12 of the support pins 10 can correspond to the topography of the PCB 100 and the components 102 mounted thereon.

Figure 5:
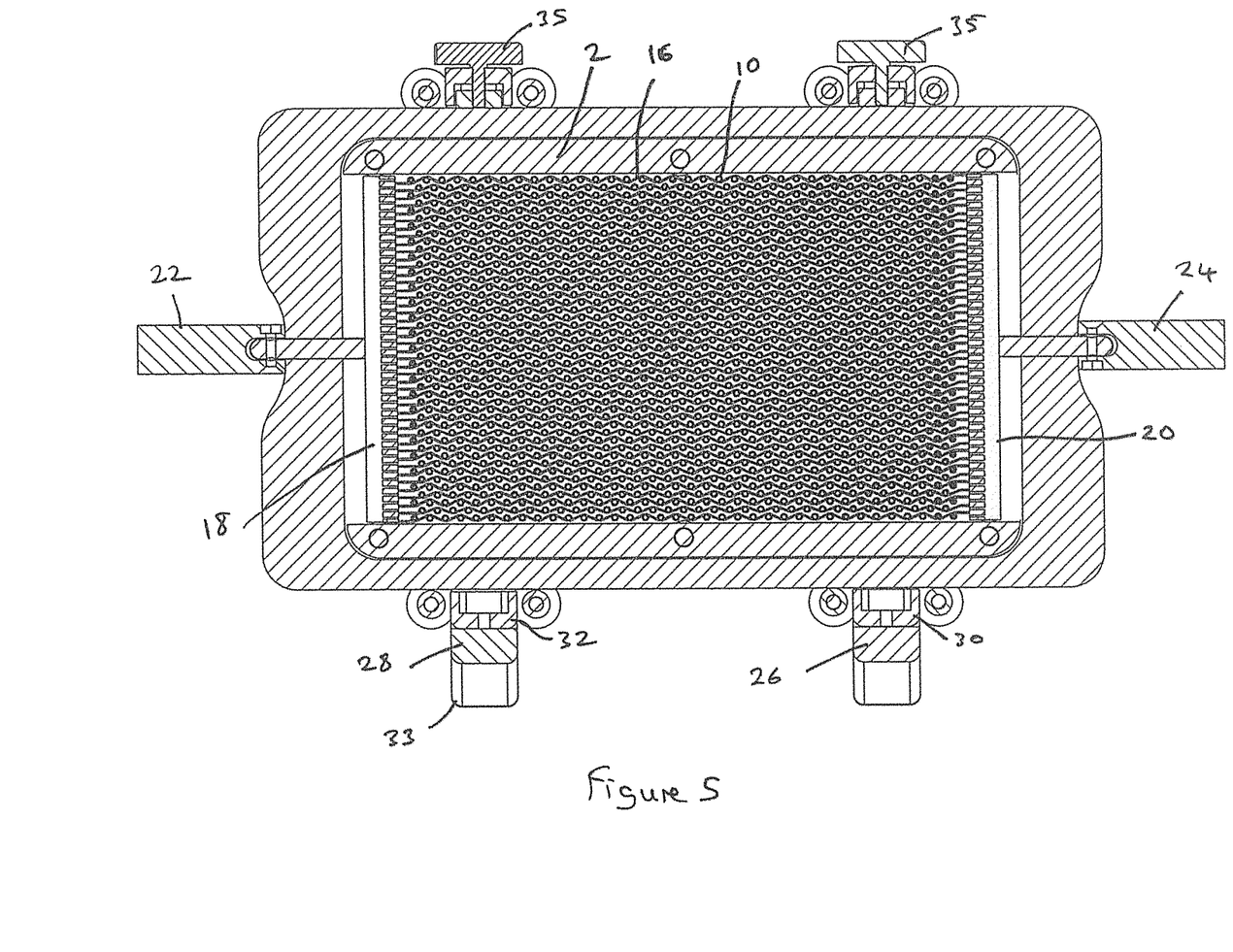
FIG. 5 is a sectional view through the apparatus of FIG. 1 showing the pin locking mechanism in its released configuration.
Figure 6:
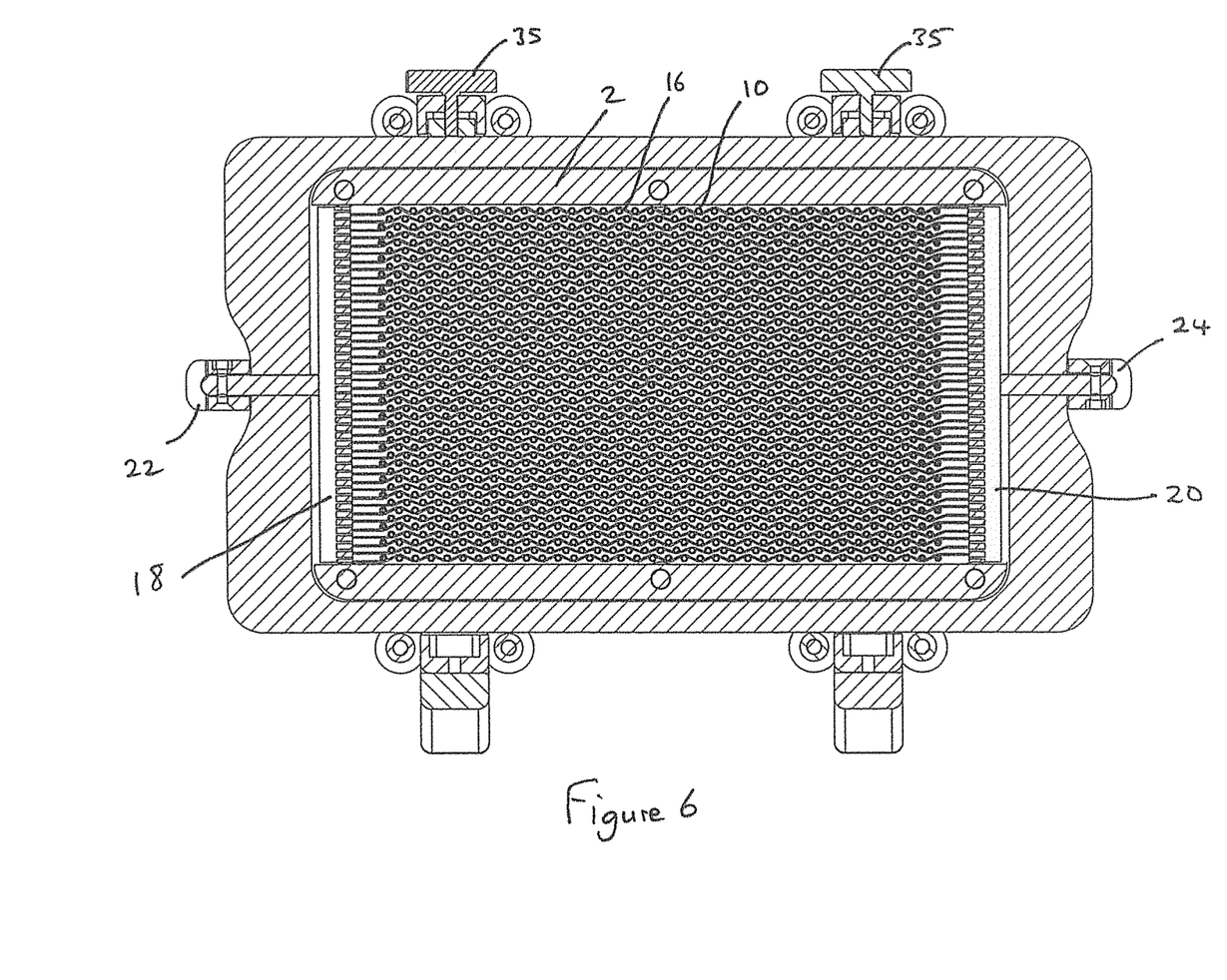
FIG. 6 is a sectional view through the apparatus of FIG. 1 showing the pin locking mechanism in its locked configuration.

A locking mechanism is provided for selectively locking the position of each support pin 10 with respect to the base plate 2. In the embodiment shown in the drawings, as best illustrated in FIGS. 5 and 6, the locking mechanism comprises parallel rows of parallel flexible elongate members 16 extending across the base plate 2, each flexible elongate member 16 being arranged to extend around the pins 10 in a respective row thereof in convolute manner.

A tensioning device is associated with the flexible members 16, whereby the tensioning device is adapted to selectively apply tension the flexible members 16, such that each flexible member 16 grips the row of pins 10 around which it extends to lock the position of said pins 10 with respect to the base plate 2.

Figure 7:
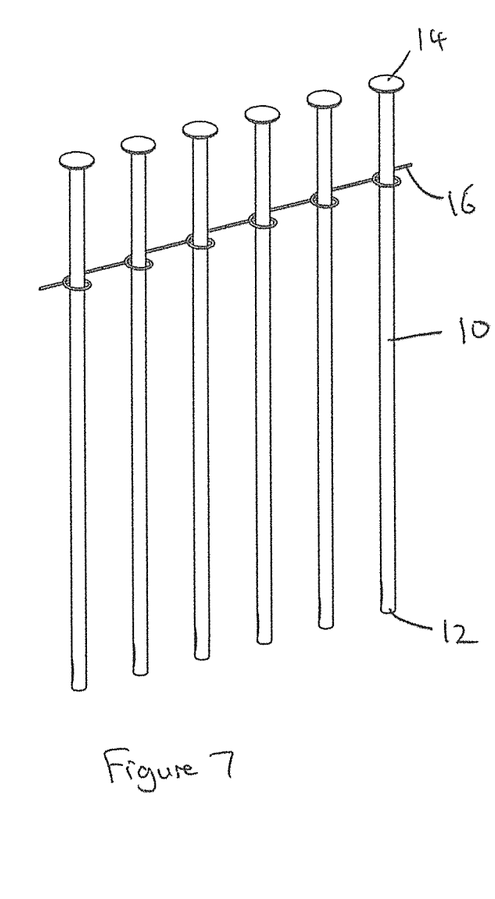
FIG. 7 is a detailed perspective view showing the passage of the elongate members around the pins.

The flexible members 16 may comprise elongate webs, tapes, threads, wires or cords and may be formed from a plastic web, polymeric or natural fibre or metal wire. The flexible members 16 may extend around the pins 10 in a respective row in zig zag fashion. Preferably each flexible member 16 is wrapped around each support pin 10 in the respective row, as illustrated in FIG. 7.

In the embodiment shown in the drawings, each flexible member is attached to and extends between a pair of transversely extending anchor members 18,20, extending parallel to the ends of the base plate 2. Each anchor member 18,20 is coupled to a respective operating device, such as a cam 22,24, whereby the anchor members 18,20 can be displaced away from one another to apply tension to the flexible members 16 extending therebetween by displacing the cams 22,24 to respective release positions (shown in FIG. 5) and locking positions (shown in FIG. 6). It is envisaged that a first anchor member may be fixed with respect to the base plate while a second anchor member may be displaceable away from the first anchor member by means of a cam or similar operating device.

Parallel spaced apart clamp members 26,28 are mounted on the base plate 2 via carriers 30,32, whereby said clamp members 26,28 can hold a PCB 100 therebetween such that the PCB 100 is spaced from and parallel to the base plate. The clamp member carriers 26,28 are slideably mounted on guide rails 34,36 located or defined on either side of the base plate 2. The clamp members 26,28 may be provided with opposed "V" shaped slots for receiving opposite sides of the PCB 100 therein.

Figure 4:
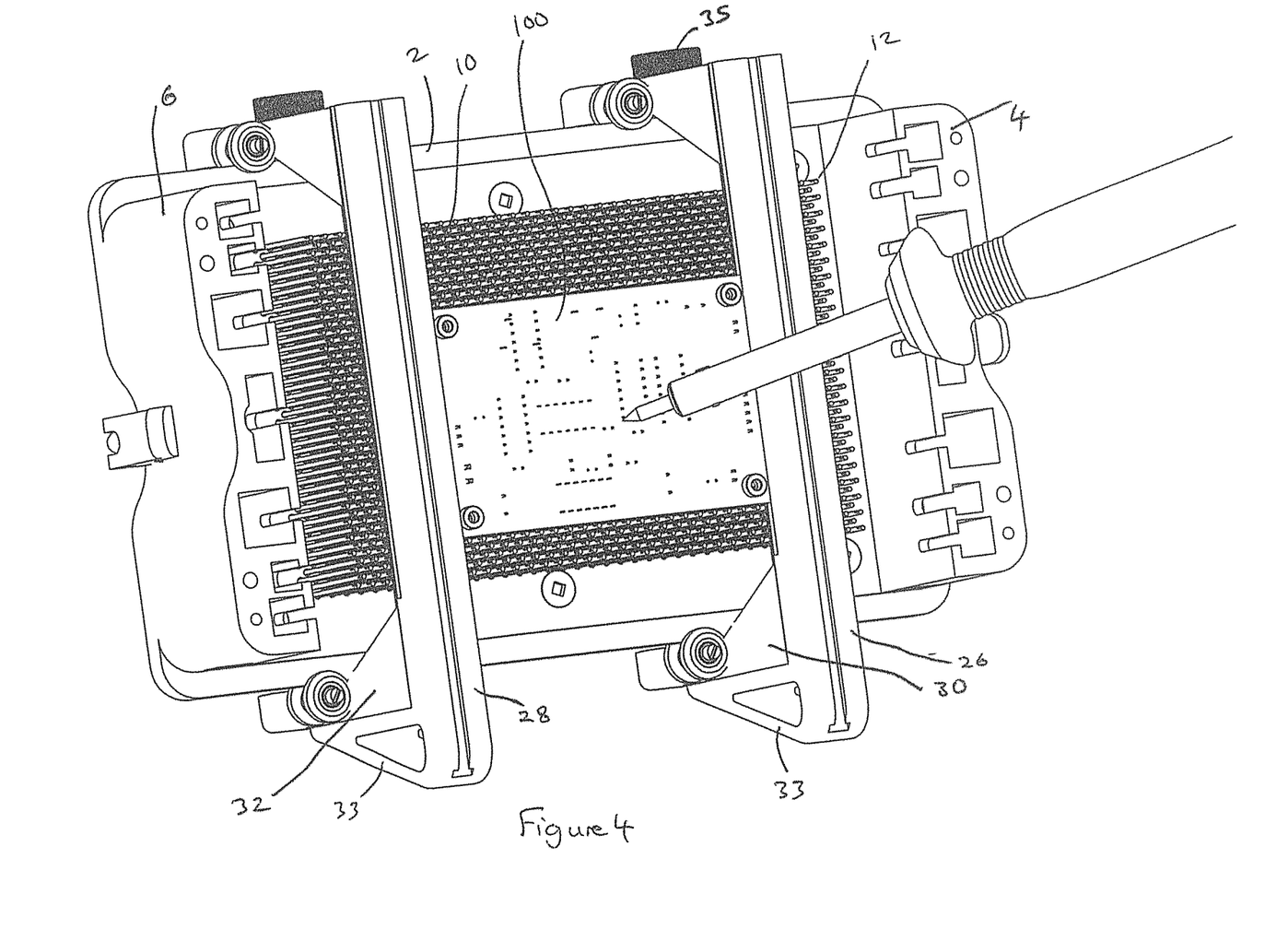
FIG. 4 is a perspective view of the apparatus of FIG. 1 in use.

Handle portions 33 may be provided on each carrier 30,32 to enable the carriers 30,32 to be moved towards and away from one another, to facilitate placement and removal of a PCB 100 therebetween. The handle portions 33 may have angled outer sides, as shown in FIGS. 1 and 4, upon which the apparatus may be placed to facilitate placement of the PCB 100 for soldering.

Figure 9:
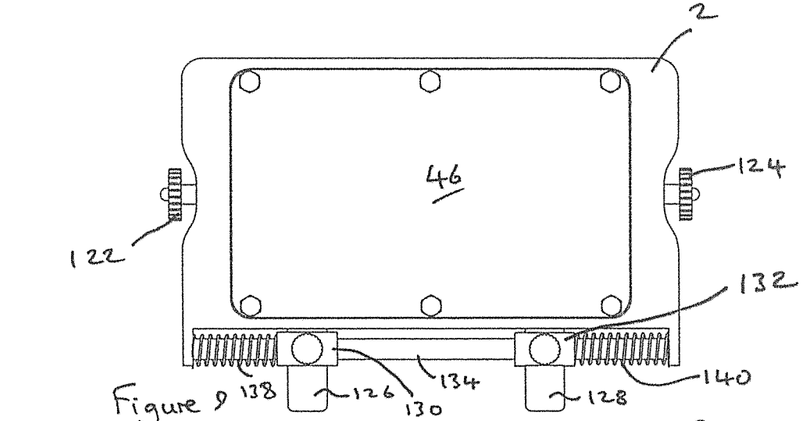
FIGS. 9 and 10 are plan views of opposite sides of an apparatus in accordance with a modified embodiment of the present invention.
Figure 10:
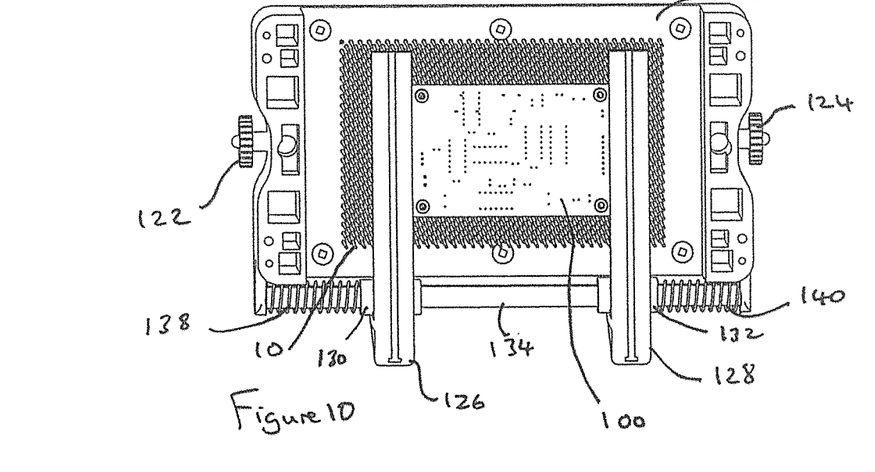
Figure 11:
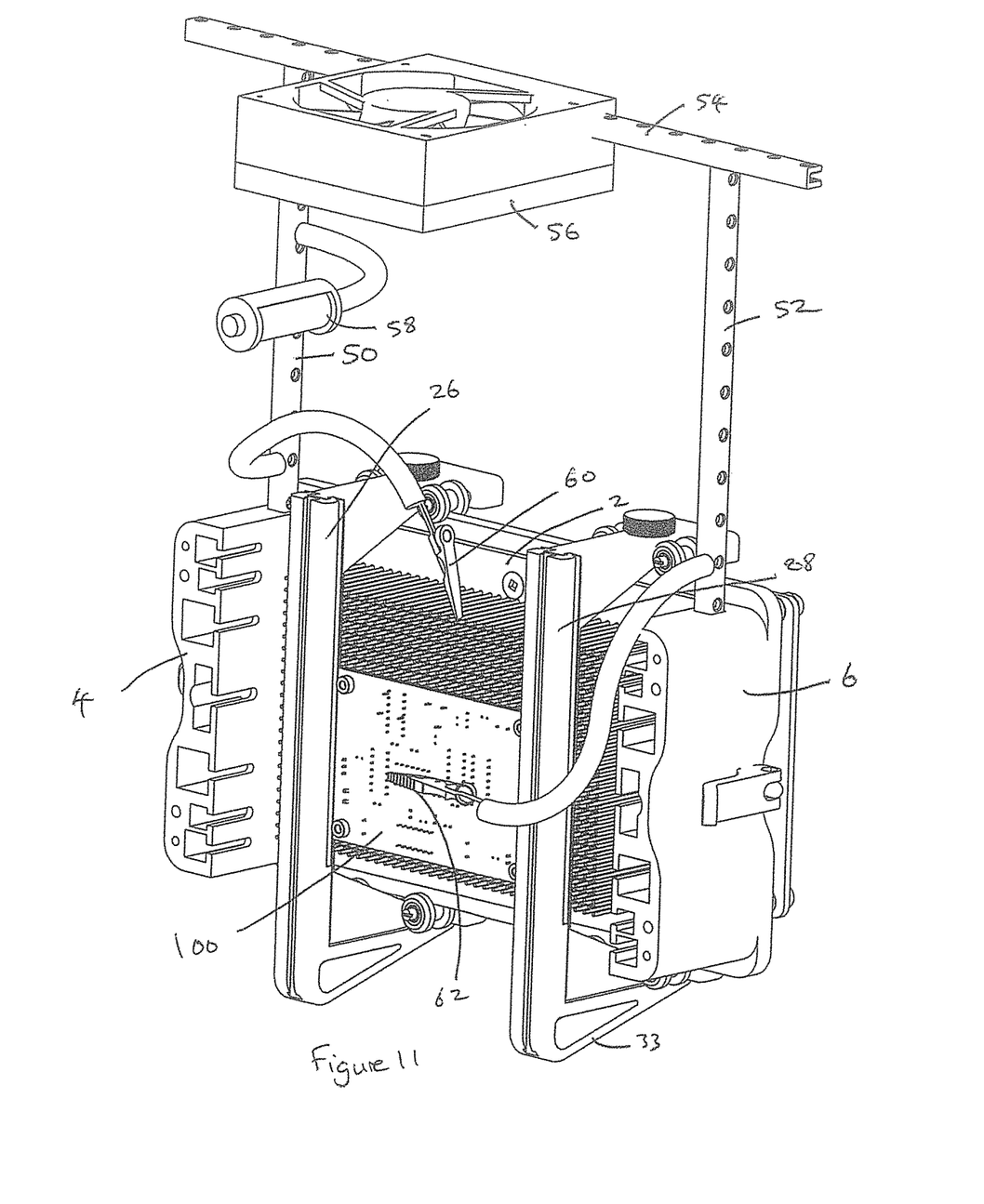
FIG. 11 is perspective view of the apparatus of FIG. 1 showing the addition of additional components.

In the embodiment shown in FIG. 3, screw locking members 35 may be provided for locking the carriers 30,32 in position on the guide rails 34,36. Such locking members may not be required wherein the clamp members 26,28 are spring biased towards on another, as shown in FIGS. 9 and 10, although may be preferred to prevent excessive force being applied to the PCB via the springs or to more securely hold the PCB.

A best shown in FIG. 3, the clamp members 26,28 may be mounted on the carriers 30,32 via slides 42,44 to enable the clamp members 26,28 to be transversely slid outwards, in a direction parallel to the base plate 2, to a loading position to one side of the base plate 2, as shown in FIG. 2, and returned to an operative position adjacent the base plate 2, to facilitate loading of a PCB between the clamp members 26,28.

The end plates 4,6 preferably have a height extending from the base plate 2 greater than the distance between the clamp members 26,28 and the base plate 2 such that the apparatus can rest upon the end plates 4,6, and optionally on the lower faces of the clamp members 26,28, when loading a PCB into the clamp members 26,28, as shown in FIG. 1.

A support plate 46 may be mounted on the base plate 2 to extend parallel to the base plate 2 via a plurality of support legs 48 extending transverse to the base plate 2 on an opposite side of the base plate 2 to the clamp members 26,28. The apparatus may be arranged to rest on the support plate 46, or on the ends of the support legs 48, when the apparatus is arranged with the clamp members 26,28 uppermost, as shown in FIG. 3. The support plate 46 may also serve to retain the pins 10 within the apertures 8 in the base plate 2 by limiting the distance that the pins 10 can move out of the base plate 2, as shown in FIG. 1.

Figure 8:
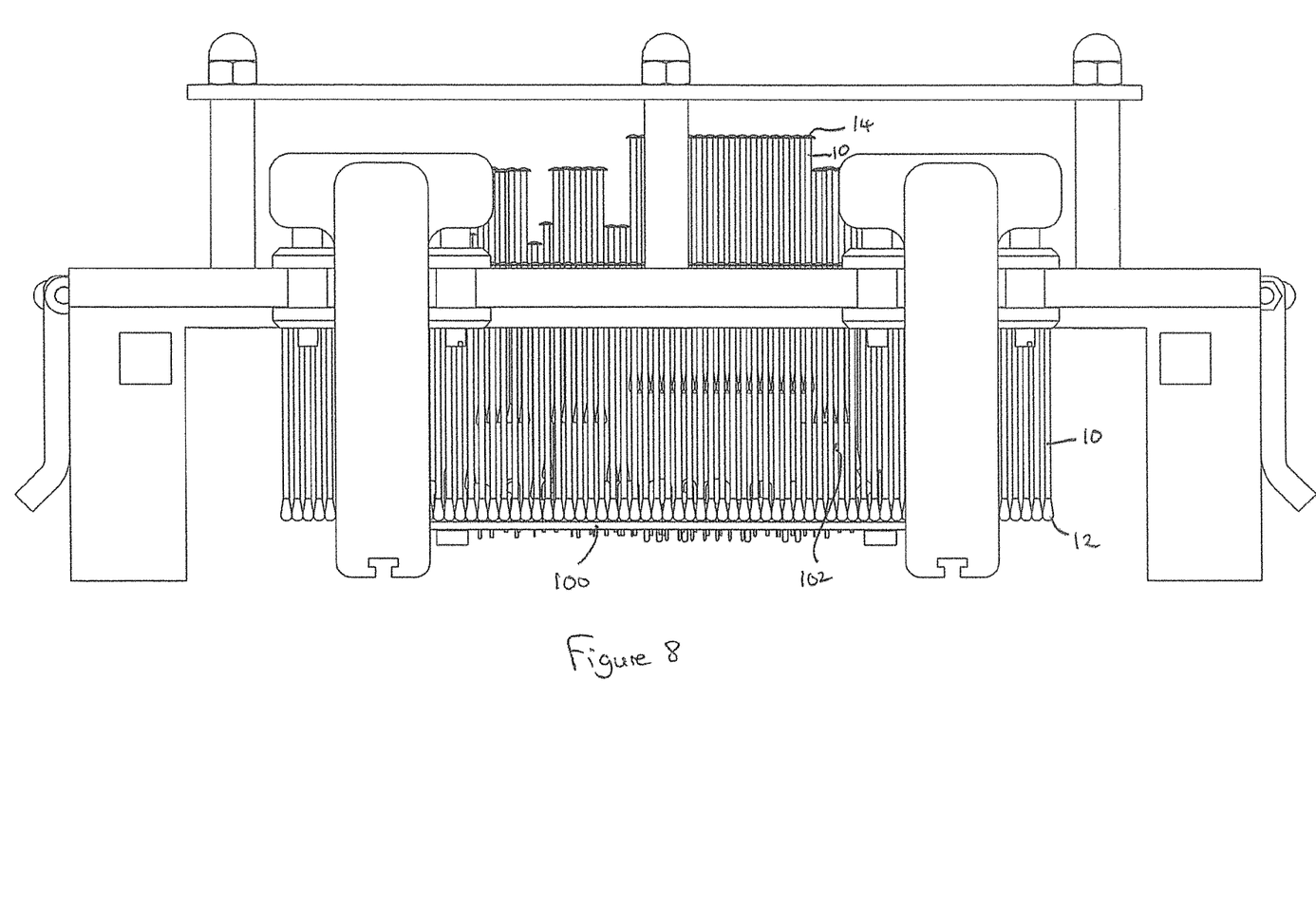
FIG. 8 is a side view of a modified embodiment of the present invention.

In an alternative embodiment, as illustrated in FIG. 8, the first ends 12 of the pins 10 may be enlarged to provide a greater contact area between the pins 10 and the PCB 100 and any components 102 mounted thereon. The enlarged end of each pin 10, or possible the entire pin, may be formed from a rigid plastic material, such as a Vespel®, a polyimide engineering plastic manufactured by Dupont®.

In use, firstly the apparatus is placed in a loading configuration, with the support plate 46 uppermost, resting on the end plates 4,6, with the cams 22,24 in their locking positions to retain the support pins 10 in a fully retracted position with respect to the base plate 2, abutting the support plate 46, as shown in FIG. 1. The clamp members 26,28 may be slid out to their loading position to facilitate insertion of the PCB 100. The carriers 30,32 are pushed away from one another using the handle portions 33, and a PCB 100 having components 102 mounted thereon is located between the clamp members 26,28.

With the PCB 100 beneath the base plate 2, the cams 22,24 are moved to their release position, releasing the tension on the elongate members 16, thus allowing the support pins 10 to fall under the action of gravity until the first end 12 of each pin 10 abuts the PCB 100 or components mounted thereon 102 located therebeneath, as shown in FIG. 2. The cams 22,24 may then be moved to their locking position, tensioning the elongate members 16 and thereby locking each pin 100 in position.

The apparatus can then rotated or inverted to a working configuration, as shown in FIGS. 3 and 4, to rest upon the support plate 46 and/or support legs 48 or the handle portions 33, with the PCB located between the clamp members 26,28 and the components 102 mounted thereon supported and retained in position by the support surface defined by the first ends 12 of the support pins 10.

In such configuration, the pins of the components 102 can be soldered to the PCB 100, as illustrated in FIG. 4.

As shown in FIGS. 9 and 10, in an alternative embodiment springs 138,140 may be mounted on guide rails 134,136 upon which the carriers 130,132 of the clamp members 126,128 are slideably mounted to bias the carriers 130,132, and thus the clamp members 126,128, towards one another to engage and hold opposite sides of the PCB 100 when located between the clamp members 126,128.

In the embodiment shown in FIGS. 9 and 10, the cams 22,24 have been replaced by nuts or control knobs 122,124 threadedly engaged on threaded projections 125 extending from the anchor members through apertures in side walls of the base plate 2, whereby the control knobs 122,124 may be rotated or tightened to pull the anchor members away from one another and apply tension to the flexible members 16 to lock the pins 10 in position.

The apparatus may be adapted to facilitate other operations on the PCB 100. For example, support posts 50,52 may be provided on either side of the base plate 2, extending from the base plate 2 beside each end plate 4,6, whereby additional components may be mounted on the support posts 50,52. In the example shown in FIG. 11, a support frame 54 may be mounted on the support posts 50,52, upon which may be mounted other components, as a fan 56, light 58 and clips 60,62 for facilitating placement of the components 102 onto the PCB 100 and/or for testing the assembled circuit. In such case, the PCB 100 may be mounted between the clamp members 26,28 with the components uppermost, if required.

It is envisaged that the apparatus may be mounted in a chassis, whereby the base plate 2 may be rotated about a horizontal axis between the loading configuration and working configurations described above.

The present invention provides an apparatus for holding a PCB to facilitate the assembly and soldering of components onto the PCB whereby the support pins 10 provide a reconfigurable support surface that can readily conform to the topography of the PCB and components, wherein the pins can be readily and reliably locked in position by virtue of the tensioned elongate members to support the components during soldering without placing any stress on the PCB. The apparatus can also facilitate other operations on the PCB, during both assembly and testing, by reliably and stably supporting the PCB while permitting full access to either side of the PCB as required.

Figure 12:
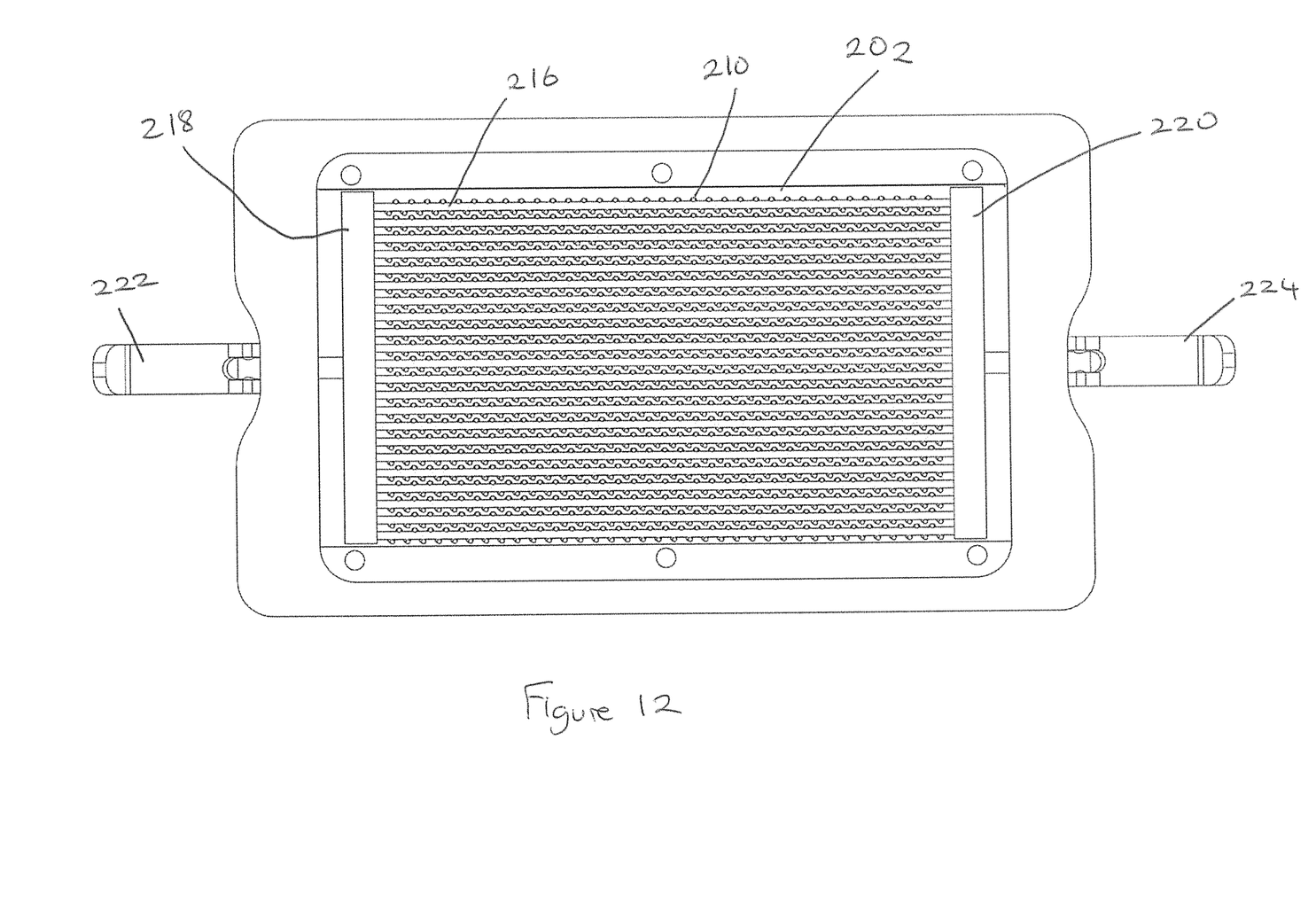
FIG. 12 is a plan view of an apparatus for holding a printed circuit board in accordance with a further embodiment of the present invention showing the pin locking mechanism in its locked configuration.
Figure 13:
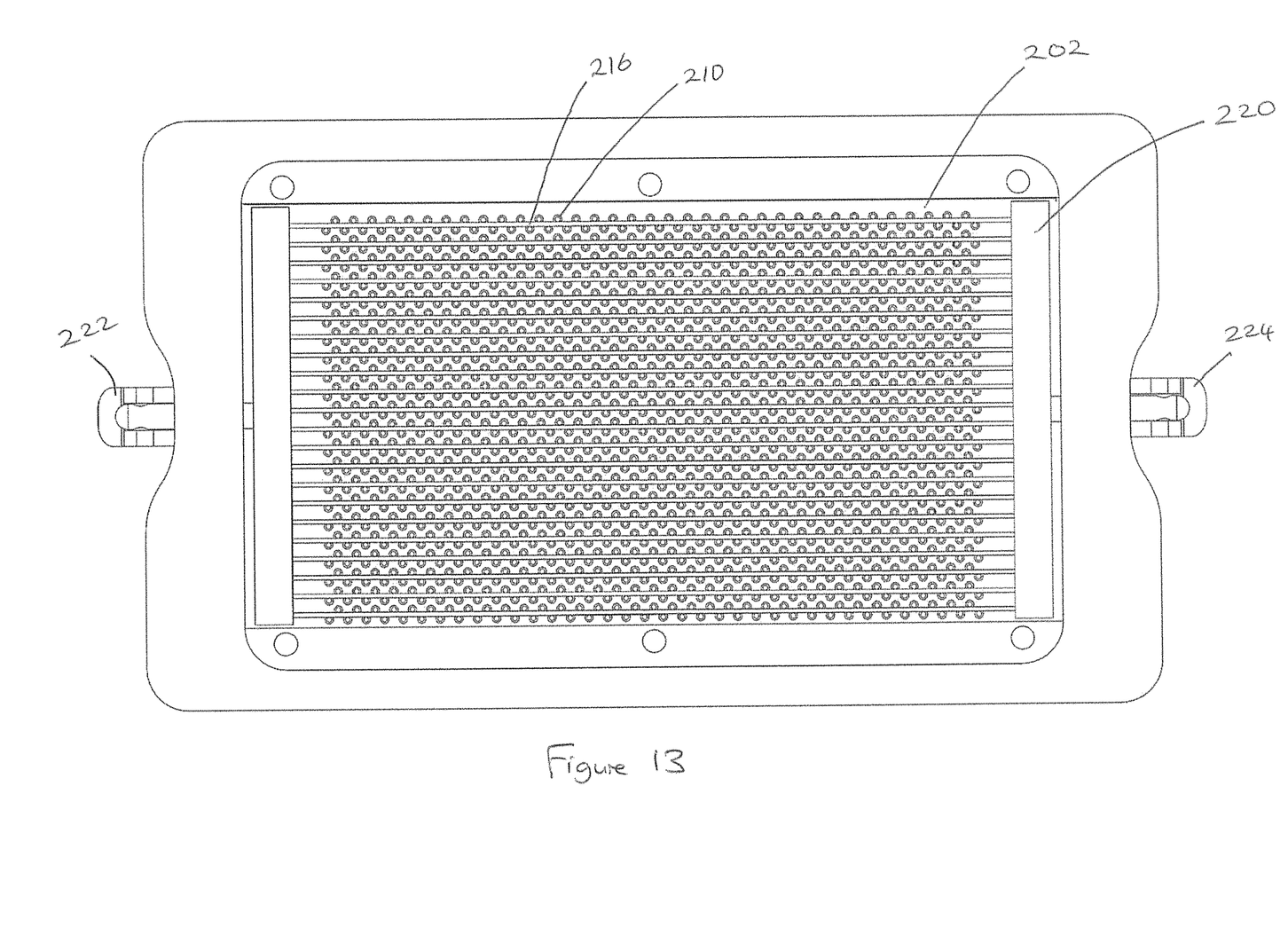
FIG. 13 is a plan view of the apparatus of FIG. 12 showing the pin locking mechanism in its released configuration.

A locking mechanism for selectively locking the position of each support pin 210 with respect to the base plate 202 in accordance with a further embodiment of the invention is shown in FIGS. 12 and 13. The locking mechanism comprises s plurality of parallel elongate flexible members 216 formed from an elastic material extending across the base plate 202, each elongate member 216 being arranged to extend between adjacent rows of support pins 210. The thickness of each flexible member 216 is greater than the distance between the adjacent rows of pins 210 between which it extends, such that, when in a relaxed state, the sides of the flexible member 216 engage and grip the pins to lock the pins 210 in place with respect to the base plate 202, as shown in FIG. 12.

A tensioning device is associated with the flexible members 216, whereby the tensioning device is adapted to selectively apply tension to the flexible members 216, such that each elastic flexible member 216 stretches, causing a reduction in the thickness of the flexible members such that the pins 210 are free to move with respect to the base plate 2.

Each flexible member 216 is attached to and extends between a pair of transversely extending anchor members 218,220, extending parallel to the ends of the base plate 202. Each anchor member 218,220 is coupled to a operating device, such as a cam 122,124, whereby the anchor members 218,220 can be displaced away from one another to apply tension to the flexible members 216 extending therebetween by displacing the cams 222,224 from respective release positions (shown in FIG. 12) to tensioning positions (shown in FIG. 13), to stretch the flexible members 216 and release the pins 210. When it is desired to lock the position of the pins 210 with respect to the base plate 202, the cams 122,124, can be operated to displace the anchor members 218,220 towards one another, releasing or relaxing the tension on the flexible members 216 such that they once again expand to their original thickness and grip the pins 210 therebetween.

The invention is not limited to the embodiment(s) described herein but can be amended or modified without departing from the scope of the present invention.

The invention claimed is:

1. An apparatus for holding a printed circuit board when mounting components thereon, said apparatus comprising a base plate, a mounting device for mounting a printed circuit board spaced from and substantially parallel to the base plate, a plurality of elongate support pins, arranged in an array of rows and columns, extending through respective holes within the base plate to extend transversely from the base plate, the support pins being independently positionable in height with respect to the base plate to define a configurable support surface for supporting components mounted on the printed circuit board during soldering, wherein the height that each pin extends from the base plate can be adjusted such that the support surface defined by the support pins can correspond to the topography of the printed circuit board and the components mounted thereon, a locking mechanism in the form of elongate flexible members arranged to extend around each row of support pins in convolute manner to grip and lock the position of the pins in each row when tension is applied to the flexible members by a tensioning device such that the flexible members can be reconfigured between a tensioned configuration and a relaxed configuration; wherein the elongate flexible members are arranged in a plurality of parallel rows corresponding to said rows of said array of support pins, said tensioning device comprising a pair of opposed anchor members between which the elongate flexible members extend, at least one of said anchor members being displaceable away from the other of said anchor members by an actuating device to define said tensioning device, whereby operation of said actuating device displaces at least one anchor member away from the other to apply tension to the elongate flexible members to place them in their tensioned configuration, thereby locking the support pins in position within their apertures.

2. An apparatus as claimed in claim 1, wherein said actuating device comprises a cam having a cam surface arranged to act upon the at least one anchor member to displace said at least one anchor member away from the other when moved to an operative configuration, thus applying tension to said elongate flexible members, and to release tension on said elongate flexible members when the cam is moved to an inoperative configuration.

3. An apparatus as claimed in claim 2, wherein said cam includes an actuating lever for moving said cam between its operative and inoperative configurations.

4. An apparatus as claimed in claim 1, wherein said actuating device comprises a nut or knob threadedly engaged on a cooperating portion of said at least one anchor member, whereby the nut or knob can be screwed onto said cooperating portion of the anchor member to displace the anchor members away from each other, thus applying tension to the elongate flexible members.

5. An apparatus as claimed in claim 1, wherein each elongate flexible member is attached to and extends between a pair of transversely extending anchor members extending parallel to the ends of the base plate, each anchor member being associated with a respective actuating device, whereby operation of the actuating device displaces said anchor members away from one another to apply tension to the flexible members extending therebetween.

6. An apparatus as claimed in claim 5, wherein each actuating device comprises a lever operated cam having a cam surface arranged to act upon the respective anchor member to displace said anchor members away from one another when the cams are moved to an operative configuration, thus applying tension to said elongate flexible members, and to release tension on said elongate flexible members when the cams are moved to an inoperative configuration.

7. An apparatus as claimed in claim 1, wherein said mounting device comprises a pair of opposed clamp members spaced from and extending parallel to said base plate, whereby said clamp members are adapted to engage opposite sides of a PCB to hold the PCB spaced from and parallel to said base plate at a position whereby a first end of said support pins can act against the PCB and any components mounted thereon.

8. An apparatus as claimed in claim 7, wherein said clamp members are mounted on the base plate via respective carriers, each carrier being slideably mounted on the base plate for movement in a direction parallel to the base plate to permit the clamp members to be moved towards and away from one another.

9. An apparatus as claimed in claim 8, wherein said carriers are slideably mounted on parallel guide rails or tracks arranged on either side of said base plate.

10. An apparatus as claimed in claim 9, wherein said carriers are providing with a locking mechanism for locking the position on the carriers on the guide rails or tracks.

11. An apparatus as claimed in claim 9, wherein said carriers are provided with a biasing device biasing said clamp members towards one another.

12. An apparatus as claimed in claim 11, wherein said biasing device comprise springs mounted on said guide rails or tracks.

13. An apparatus as claimed in claim 7, wherein said clamp members are mounted on said carriers via respective slides whereby each clamp member can be slid laterally with respect to the base plate between a loading position located to one side of the base plate and an operative position facing said base plate.

14. An apparatus as claimed in claim 1, wherein a support mechanism is provided on the base plate extending from the base plate to allow the apparatus to rest upon a surface upon said support mechanism, in a first configuration with said mounting device beneath said base plate and a second configuration with said mounting device above the base plate, the apparatus being moveable between said first and second configurations by inverting the apparatus, said pins are adapted to fall under gravity into contact with a populated side of a printed circuit board assembly when the PCB is mounted is said mounting device with the apparatus in its first configuration and when said locking mechanism is operated to release said pins to slide freely within the apertures in the base plate, the underside of the PCB being exposed to facilitate soldering of the pins when the apparatus is in its second configuration, with the locking mechanism operated to lock the support pins in their apertures such that the pins provide a support surface for the populated side of the PCB.

15. An apparatus as claimed in claim 1, wherein said support pins are provided with enlarged ends to prevent the support pins from falling out of the apertures.

16. An apparatus as claimed in claim 1, wherein the pins are formed from a rigid metallic or plastic material.

17. An apparatus as claimed in claim 1, wherein the pins are coated with a coating that is at least one of: electrically or thermally insulating.

18. An apparatus as claimed in claim 17, wherein said coating comprises polyphenylene sulphide (PPS) or polyetheretherketone (PEEK).

19. An apparatus as claimed in claim 1, wherein said at least one flexible member is formed from an elastic material, and wherein said at least one flexible member is located between adjacent rows of support pins, wherein said at least one flexible member, when in its relaxed configuration, is dimensioned to engage and grip the sides of the support pins in said adjacent rows to lock the position of said pins with respect to the base plate, and wherein, when the at least one flexible member is elastically stretched when in its tensioned configuration such that the width of the at least one flexible member is reduced to the extent that the at least one flexible member no longer grips the sides of the support pins in said adjacent rows, allowing the pins to move freely with respect to the base plate.

* * * * *

UNITED STATES PATENT AND TRADEMARK OFFICE
CERTIFICATE OF CORRECTION

PATENT NO. : 10,798,856 B2
APPLICATION NO. : 15/780256
DATED : October 27, 2020
INVENTOR(S) : Niall Barrett

Page 1 of 1

It is certified that error appears in the above-identified patent and that said Letters Patent is hereby corrected as shown below:

On the Title Page

In the Item (56) References Cited section:
Please insert:
--20030203348 A1 10/2003 Chemrov et al.
DE 10152330 C1 4/2003--.

Signed and Sealed this
Twenty-fourth Day of November, 2020

Andrei Iancu
*Director of the United States Patent and Trademark Office*